(12) United States Patent
Yang et al.

(10) Patent No.: US 10,026,477 B2
(45) Date of Patent: Jul. 17, 2018

(54) SELECTOR RELAXATION TIME REDUCTION

(71) Applicant: Hewlett Packard Enterprise Development LP, Houston, TX (US)

(72) Inventors: Jianhua Yang, Palo Alto, CA (US); Ning Ge, Palo Alto, CA (US); John Paul Strachan, San Carlos, CA (US); Gary Gibson, Palo Alto, CA (US); Warren Jackson, San Francisco, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/329,845

(22) PCT Filed: Jan. 28, 2015

(86) PCT No.: PCT/US2015/013214
§ 371 (c)(1),
(2) Date: Jan. 27, 2017

(87) PCT Pub. No.: WO2016/122472
PCT Pub. Date: Aug. 4, 2016

(65) Prior Publication Data
US 2017/0271009 A1   Sep. 21, 2017

(51) Int. Cl.
*G11C 11/00* (2006.01)
*G11C 13/00* (2006.01)

(52) U.S. Cl.
CPC ........ *G11C 13/0069* (2013.01); *G11C 13/004* (2013.01)

(58) Field of Classification Search
CPC ...... G11C 11/36; G11C 11/38; G11C 11/4418
(Continued)

(56) References Cited

U.S. PATENT DOCUMENTS 3,626,389 A * 12/1971 Waaben ............... G11C 11/36
                                                    365/175
3,938,027 A *  2/1976 Iwamoto ............... H02M 1/06
                                                    327/473
(Continued)

FOREIGN PATENT DOCUMENTS

WO   WO-2009140305   11/2009
WO   WO-2010014064    2/2010

OTHER PUBLICATIONS

Burr; G.W., et al., Access Devices for 3D Crosspoint Memory, Jul. 24, 2014, American Vacuum Society, J. Vac. Sci. Technology B 32(4), pp. 040802-1-040602-23.
(Continued)

*Primary Examiner* — Han Yang
(74) *Attorney, Agent, or Firm* — Law Firm of Timothy Myers (57) ABSTRACT

In one example, a volatile selector is switched from a low conduction state to a first high conduction state with a first voltage level and then the first voltage level is removed to activate a relaxation time for the volatile selector. The relaxation time is defined as the time the first volatile selector transitions from the high conduction state back to the low conduction state. The volatile selector is switched with a second voltage level of opposite polarity to the first voltage level to significantly reduce the relaxation time of the volatile selector.

15 Claims, 5 Drawing Sheets (58) Field of Classification Search
USPC .................. 365/148, 163, 171, 173, 158
See application file for complete search history.

(56) References Cited

U.S. PATENT DOCUMENTS

| | | |
|---|---|---|
| 5,247,210 A | 9/1993 | Swanson |
| 5,801,417 A | 9/1998 | Tsang |
| 6,043,516 A | 3/2000 | Schulze |
| 6,219,194 B1 | 4/2001 | Stein et al. |
| 7,087,920 B1 | 8/2006 | Kamins |
| 7,382,647 B1 | 6/2008 | Gopalakrishnan |
| 8,063,395 B2 | 11/2011 | Xia et al. |
| 8,134,857 B2 | 3/2012 | Lin et al. |
| 8,743,598 B2 | 6/2014 | Pellizzer et al. |
| 8,867,266 B2 | 10/2014 | Bessho et al. |
| 2007/0274120 A1 | 11/2007 | Pinnow et al. |
| 2008/0304307 A1 | 12/2008 | Gopalakrishnan |
| 2009/0014707 A1 | 1/2009 | Wei et al. |
| 2009/0323391 A1 | 12/2009 | Scheuerlein et al. |
| 2010/0220523 A1 | 9/2010 | Modha et al. |
| 2011/0240952 A1 | 10/2011 | Yang et al. |
| 2011/0310663 A1 | 12/2011 | Bessho et al. |
| 2012/0012809 A1 | 1/2012 | Yang et al. |
| 2012/0265719 A1 | 10/2012 | Modha et al. |
| 2014/0034893 A1 | 2/2014 | Nakabayashi et al. |
| 2014/0169062 A1 | 6/2014 | Lee et al. |
| 2016/0099306 A1* | 4/2016 | Cheng .................. H01L 29/402 257/476 |

OTHER PUBLICATIONS

Electronic Materials Conference 2009 Final Program, 125 Pgs.
International Searching Authority, The International Search Report and the Written Opinion, PCT/US2010/032071, dated Dec. 29, 2010, 8 Pgs.
International Searching Authority, The International Search Report and the Written Opinion, PCT/US2015/013214, dated Oct. 19, 2015, 12 Pgs.

* cited by examiner

SELECTOR RELAXATION TIME REDUCTION

CROSS REFERENCE TO RELATED APPLICATIONS

This Application is related to commonly assigned U.S. Pat. No. 8,879,300, filed Jan. 19, 2012 which claims priority to PCT application PCT/US2010/032071, filed Apr. 22, 2010, and is hereby incorporated by reference herein.

BACKGROUND

Memory bandwidth continues to be a limitation on the ability of high speed CPU processors to make effective use of their processing capabilities. CPU designers have developed cache memory to reduce the average time to access data from the main memory. A cache is a smaller, faster memory which stores copies of the data from frequently used main memory locations. Most CPUs have different independent caches, including instruction and data caches, where the data cache is usually organized as a hierarchy of more cache levels (L1, L2, L3, etc.). Various techniques such as larger L1 and L2 caches have limitations as the cost of the silicon and the operating power of the Static RAM (SRAM) memory are limiting their use. Recent approaches have been to add a Level 3 to help with getting data from system memory to multiple processor cores. Intel® has recently added a level 4 (L4) on package cache by using embedded DRAM (Dynamic RAM) that is shared between the multiprocessor cores and the on-die graphics processor and also used as a victim cache for the CPU's L3 cache.

Recognizing years of fading processor speed improvement due to conventional memory limitations and the futility of adding more levels of cache, significant R&D is currently directed to designing and manufacturing nanoscale memory devices. These devices offer the potential to replace ail cache levels as well as the system DRAM memory and potentiality the storage memory often implemented in flash, optical, or magnetic technologies. These nanoscale memory devices are typically implemented in cross-bar arrays allowing for very dense, low cost, and low power memory systems that offer to not only dramatically increase the processing speeds by orders of magnitude, but also lower cost. These improvements come in addition to decreasing power consumption for the next generation of computing devices without having to rely on the lithographic shrinking of transistors. However, to make this future vision possible, various technological issues need to be addressed to continually improve the performance of devices which have been presently fabricated.

BRIEF DESCRIPTION OF THE DRAWINGS

The claimed subject matter is better understood with reference to the following drawings. The elements of the drawings are not necessarily to scale reactive to each other. Rather, emphasis has instead been placed upon clearly illustrating the claimed subject matter. Furthermore, like reference numerals designate corresponding similar parts through the several views.

DETAILED DESCRIPTION

Various examples of the present claimed subject matter are directed to nanoscale electronic devices that integrate non-volatile storage devices with volatile selector switching devices. The nanoscale electronic devices are configured with fast drift ionic species, such as fast diffusion atoms, to prevent breakdown along diode-like interlaces in the non-volatile storage devices when read and write (programming) voltages are applied while also providing the volatile selector function.

The non-volatile storage devices may be a resistive memory device, one example being a "memristor", The term "memristor" is short for "memory resistor." Memristors are a class of passive two-terminal circuit elements that maintain a functional relationship between the time integrals of current and voltage. This integral results in resistance varying according to the device's memristance function. Specifically engineered memristors provide controllable resistance useful for switching current. The memristor is a special case in so-called "memristive systems." described as a class of mathematical models useful for certain empirically observed phenomena, such as the firing of neurons. The definition of the memristor is based solely on fundamental circuit variables, similar to the resistor, capacitor, and inductor. However, the necessarily nonlinear memristors may be described by any of a variety of time-varying functions. As a result, memristors do not belong to linear time-independent circuit models. A linear time-independent memristor is simply a conventional resistor. The claimed subject matter is applicable to both non-volatile resistor and memristor storage devices, however, for ease of understanding and brevity, the non-volatile memristor storage device will be illustrated as just one example.

The creation of an integrated volatile selector, having fast diffusion atoms, together with a non-volatile storage device, such as a memristor, allows for greater than 4 orders of magnitude of on/off ratio greatly reducing sneak paths in cross-bar arrays, making such cross-bar array's implementation practical. Nonetheless, while providing a high magnitude voltage to program or read a non-volatile storage device, a selector integrated with the memristor also experiences a high voltage. This high voltage turns the selector from its ground state, i.e. high resistance state, to a high conductance (low resistance) state temporarily, by for instance forming a chain of fast diffusion atoms in the selector. When this high magnitude voltage is removed, there is a relaxation time in the selector during which the fast diffusion atoms disperse within the interior of the selector. This relaxation may take a time greater than 1 microsecond, such as a TiN/AgOx:SiOx/TiN device, and even up to milliseconds in some implementation examples, as the volatile selector transitions from its high conductive state to a low conductive state (high resistance), This relaxation time temporarily allows sneak currents from other elements of the crossbar array through the volatile selector. These sneak currents may prevent the crossbar array from being further operated for reading or programming other non-volatile storage device in the cross-bar array until the volatile selector relaxes substantially back to its low conductance ground state. This relaxation time can significantly slow down the crossbar operation limiting its ability to replace high-speed memory in some applications.

To prevent the relaxation time from slowing down the cross-bar operation, an electrical operation protocol has been developed by the inventors to provide a short voltage pulse of opposite polarity and duration after the programming or read pulse voltage appropriate to significantly reduce the relaxation time from the at least 1 microsecond to tens of nanoseconds by forcing the fast diffusion atoms to diffuse quicker under a reversed-bias electric field. This additional pulse returns the volatile selector to its original low conduction ground state thereby preventing substantial leakage current through the selector and thus provide overall faster cross-bar random-access time. This additional pulse has a sufficiently low magnitude and/or duration to ensure that the selector does not transition back to a high conduction state.

The semiconductor devices of the present claimed subject matter are applicable to a broad range of semiconductor devices technologies and may be fabricated from a variety of semiconductor materials. The foil owing description discusses several examples of the semiconductor devices of the present claimed subject matter as implemented in silicon substrates, since the majority of currently available semiconductor devices are fabricated in silicon substrates and the most commonly encountered applications of the present claimed subject matter will involve silicon substrates. Nevertheless, the present claimed subject matter may also advantageously be employed in gallium arsenide, germanium, and other semiconductor materials. Accordingly, the present claimed subject matter is not intended to be limited to those devices fabricated in silicon semiconductor materials, but will include those devices fabricated in one or more of the available semiconductor materials and technologies available to those skilled in the art, such as thin-film-transistor (TFT) technology using polysilicon on glass substrates.

It should be also noted that the drawings are not true to scale. Further, various parts of the active elements have not been drawn to scale. Certain dimensions have been exaggerated in relation to other dimensions in order to provide a clearer illustration and understanding of the present claimed subject matter.

Moreover, while the present claimed subject matter is illustrated by examples directed to active memristor devices, it is not intended that these illustration be a limitation on the scope or applicability of the present claimed subject matter. Nor is it intended that the active memristive devices of the present claimed subject matter be limited to the physical structures illustrated. These structures are included to demonstrate the utility and application of the present claimed subject matter to the illustrated examples.

Cross-Bar Storage System

Figure 1A:
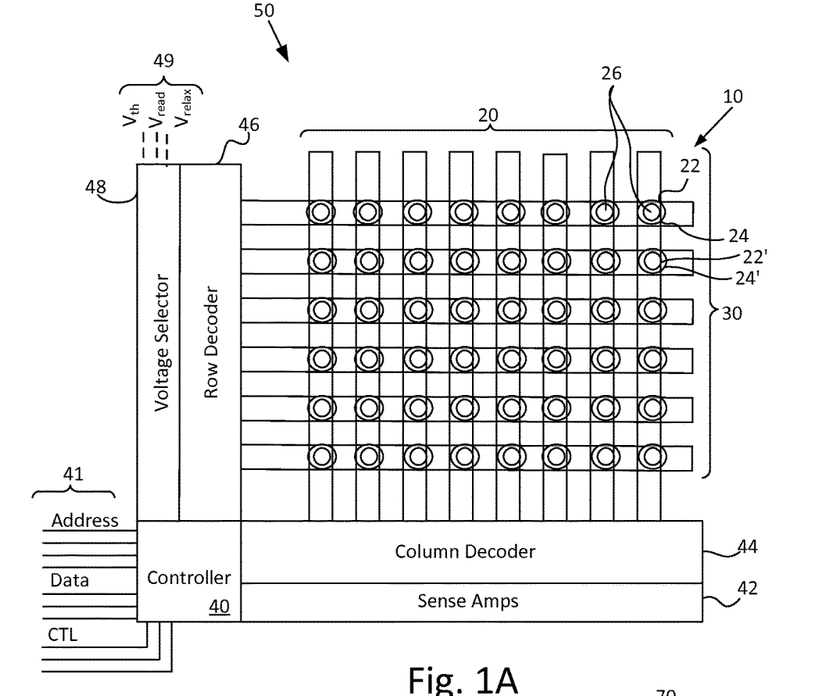
FIG. 1A is an example top view schematic of a cross-bar array in a storage system implementing a relaxation reduction pulse.

FIG. 1A is an example top view schematic of a nanowire cross-bar array 10 implementing a relaxation reduction pulse to speed up operation of the cross-bar array 10. The crossbar array 10 has a first set of conductive wires forming columns 20 and a second set of conductive wires forming rows 30 that overlap and intersect the first set of conductive wires. While shown as intersecting at right angles, the first and second set of conductive wires can intersect at 30, 45, 60, or any desired angle depending on a particular implementation. The first conductive wires are referred to in this example as columns 20 as they are shown as being vertical. The second conductive wires are referred to in this example as rows 30 as they are shown as being horizontal. These designations are just for ease of explanation and understanding and are not meant to be limiting.

The nanowire crossbar array 10 can be used to form a non volatile memory array. Each crossbar junction can be used to represent one or more bits of data. For example, a crossbar junction device can be configured to operate in two binary states: a low-resistance state (LRS) and a high-resistance state (HRS). The LRS can represent a logic bit value "1" and a HRS can represent a logic bit value "0," or vice versa. Binary data can be written into each crossbar junction device of the crossbar array 10 by changing the resistive state of the associated active region. The logic value encoded in the resistive state of a crossbar junction can be read by applying a read, or sense, voltage to one of the crossbar junction nano-wires, such as a row lines 30 nanowires, and measuring the voltage or current on the column line 20 nanowires. In some examples, rather than a set of binary states, there can be multiple levels of states, such as 3, 4, or more.

Although individual nanowires in rows 30 and columns 20 in FIG. 1 are shown with rectangular cross sections, nanowires can also have square, circular, elliptical, or more complex cross sections. The nanowires may also have many different widths or diameters and aspect ratios or eccentricities. The term "nanowire crossbar" may refer to crossbars having one or more layers of sub-microscale wires, microscale wires, or wires with larger dimensions, in addition to nanowires.

The layers can be fabricated by mechanical nano-imprinting techniques. Alternatively, nanowires can be chemically synthesized and can be deposited as layers of approximately parallel nanowires in one or more processing steps, including Langmuir-Blodgett processes. Other alternative techniques for fabricating nanowires may also be employed. Thus, a two-layer nanowire crossbar comprising first and second conductive wire layers, as shown in FIG. 1, can be manufactured by any of numerous relatively straightforward processes. Many different types of conductive and semiconductive nanowires can be chemically synthesized from metallic and semiconductor substances, from combinations of these types of substances, and from other types of substances. A nanowire crossbar may be connected to nano- or micro-scale address-wire leads or other electronic leads, through a variety of different methods in order to incorporate the nanowires into electrical circuits, including having multiple layers of cross-bar arrays 10 in 3D stacks.

At nanowire intersections, nanoscale electronic components, such as diodes, and other familiar basic electronic components, can be fabricated to interconnect two overlapping nanowires. Any two nanowires connected by a device is called a "crossbar junction." At the intersection of each row 30 and column 20 in this example is an integrated non-volatile storage device 22 and a volatile selector 24 which are integrated and essentially form a memory cell 26, which is described in more detail further on. Those memory veils 26 along with the cross-bar array 10 form a storage system 50. The volatile sector 24 is characterized as having a relaxation time when transitioning from its high conductive state (HCS) to its low conductive state (LCS) or ground rte state.

The storage system 50 includes a controller 40 coupled to voltage selector 48 with voltage signal inputs 49, row decoder 46, column decoder 44, and sense amps 42. The controller 40 typically has a set of system busses 41 such as address lines, data lines, and control lines for allowing an external processor or other memory controller to access the cross-bar array 10. The controller 40 uses logic to control by opening and closing switches with a set of first signals (see FIG. 1B) in voltage select 48, row decoder 46 and column decoder 44 to allow for programming and/or reading of one or more non-volatile storage devices 22 using one or more of the volatile selectors 24. When a program or read operation is performed on a memory cell 26 and ended by removing the program or read voltage, a relaxation time of the volatile selector begins or is activated, That is, after the volatile selector is first activated to a HCS state for reading or programming by applying an appropriate electrical bias, and once the electrical bias is removed or reduced, the HCS state of the volatile selector is activated to being to relax back to the LCS state (i.e. the high resistive ground state of the volatile selector under zero bias).

To mitigate this relaxation time, the controller 40 controls a second set of signals in voltage select 48, row decoder 46, and column decoder 44 to significantly shorten the relaxation time of the volatile selectors 24.

A third set of signals applied to the rows 30 and column 20 by the controller 40 allows for reading or programming of one or more other non-volatile storage devices 26 after the second signals have significantly shortened the relaxation time, such as by less than 100 ns or in some examples to 50 ns or even less.

Figure 1B:
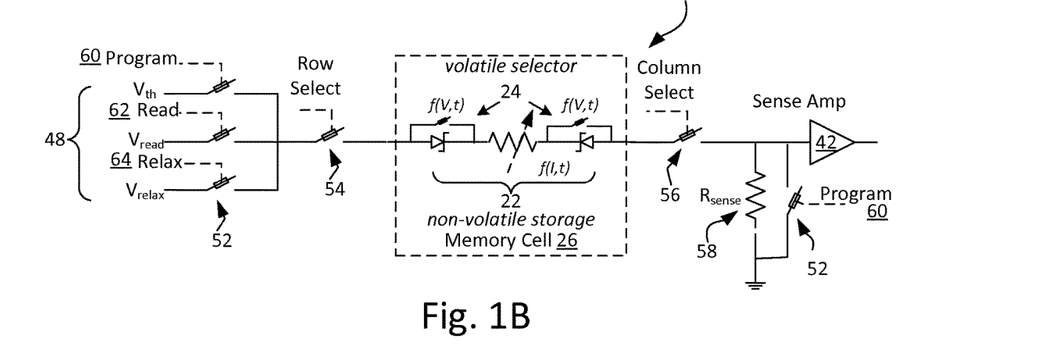
FIG. 1B is an example schematic of a switch setup in a logic controller to implement a relaxation reduction pulse along with read and programming pulses.

FIG. 1B is an example non-limiting schematic 70 of an example switch setup to implement a relaxation reduction pulse along with read and programming pulses. Other switching schemes can provide equivalent function, schematic 70 being but one example for ease of illustration. A memory cell 26 includes a volatile selector 24 integrated with non-volatile storage device 22. Non-volatile storage device 22 is illustrated as a variable resistor (with a function $f(l,t)$) in series with two Schottky-like diodes on respective ends of the variable resistor. Volatile selector 24 is illustrated as two switches across each of the two Schottky like diodes to change their function $f(V,t)$ One end of the memory cell 26 is connected to one of many row select switches 54 from the row decoder 46. The row select switch 54 further coupled to a set of switches 52 to provide a set of voltages 62 for programming ($V_{th}$), read ($V_{read}$), and relaxation reduction ($V_{relax}$). The $V_{th}$, $V_{read}$, and $V_{relax}$ voltages may be supplied by other circuitry to reverse their polarity depending on the desired change to memory cell 26, or optionally, the negative voltages can be supplied separately and additional switches used to select them as needed.

The memory cell 26 is also connected on its other end to one of many column select switches 56 in column decoder 44. The column select switch 56 is further coupled to a sense amp 42 used for reading the voltage across a sense resistor $R_{sense}$ 58. In some examples, the voltage across $R_{sense}$ 58 can be shorted by an additional switch 52 to eliminate its voltage drop during programming operations.

When programming (or writing) the non-volatile storage device 26, the first set of signals from the controller 40 control the Program 60 signal to apply $V_{th}$, select the appropriate row to close the row select 54, and the appropriate column to close the column select 56. This first set of signals applies a voltage $V_{th}$ across the memory cell at a sufficient voltage threshold that the volatile selector 24 changes to its HCS state and non-volatile storage device 22 becomes active and remembers the time integral of current that flows through the memory cell (hence a "memristor"). The first set of signals may also close the switch across $R_{sense}$ 58 with Program 60 to have better accuracy during programming. Once the first set of signals are removed, the non-volatile storage device 22 retains its learned resistance but the volatile selector 24 begins to relax to its LCS (or high resistance) ground state. This relaxation time may be between 1 microsecond (us) and 1 millisecond (ms) depending on the fabrication of the memory cell 26.

To reduce this relation time, a second set of signals is applied by the controller to switches 52 such as with Relax 64, appropriate row select 54, and column select 56 to apply $V_{relax}$ across memory cell 26, $V_{relax}$ is an opposite polarity voltage $V_{th}$ and $V_{read}$ but of a lesser magnitude to not transition volatile selector 24 to its opposite polarity high conductive state. By applying the appropriate second set of signals and $V_{relax}$, the relaxation time can be reduce to under 100 ns or less, such as 50 ns. This significantly reduces the amount of time needed to recover from a program or read operation in order to access another memory cell 26 in the cross-bar array 10.

To read another non-volatile storage device 26, the controller 40 activates a third set of signals such as Read 62, the appropriate Row Select 54, and the appropriate column select 56. This third set of signals apply a read voltage $V_{read}$ across the memory cell 26 causing current to flow at a level small enough to prevent non-volatile storage device 22 to not change its resistance but sufficient enough to have a portion of the $V_{read}$ voltage drop across $R_{sense}$ 58 thereby allowing the sense amp 42 to detect the resistance of non-volatile storage device 22 and accordingly the memory state of memory coil 26. The magnitude of $V_{read}$ is less than the magnitude of the programming voltage $V_{th}$ but sufficient to have the volatile selector 24 transition to its HCS state. When the $V_{read}$ voltage is removed by the controller 40, the volatile sector 24 again begins to relax from its HCS state to LCS state during a relaxation time of 1 us to 1 ms depending on the particular fabrication of memory cell 26. The second set of signals can be used once again to reduce this relaxation time to less than 100 ns, or on the order of tens of nanoseconds.

Selector Current/Voltage Diagrams

Figure 2A:
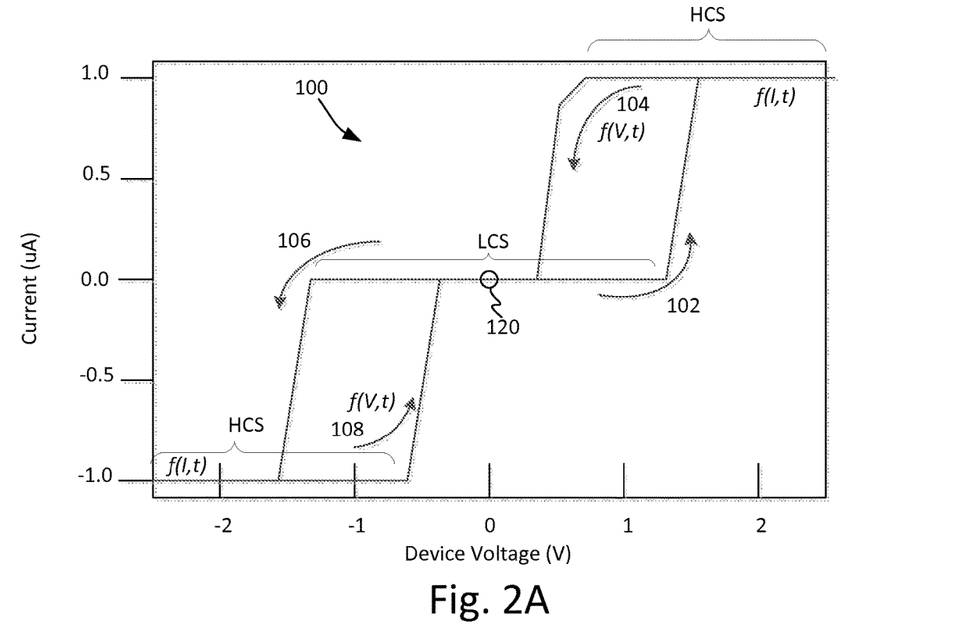
FIG. 2A is an example selector current/voltage diagram illustrating the various states of an example selector operation.
Figure 2B:
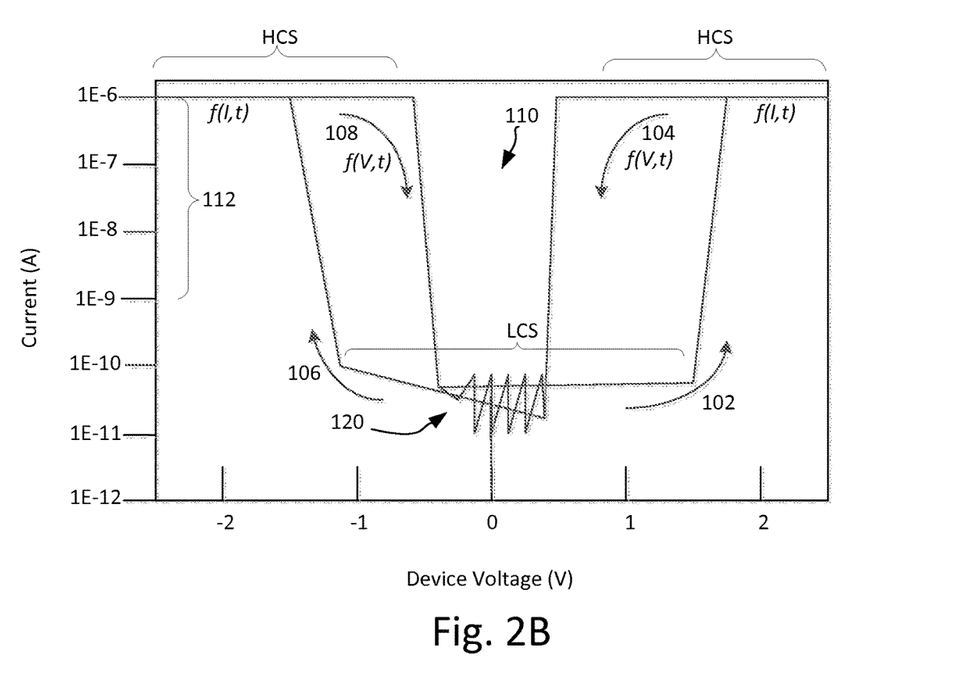
FIG. 2B is an example bi-directional exponential current/voltage diagram illustrating the levels of magnitude difference in on/off currents in the example selector of FIG. 2A.

FIG. 2A is an example selector current/voltage diagram 100 illustrating various states of volatile selector operation in one example. FIG. 26 is an example bi-directional exponential current/voltage diagram illustrating the levels of magnitude difference in on/off currents in the example selector of FIG. 2A. Because the on off ratio for this example selector is more than four orders of magnitude 112, the absolute value of the currents is used to view easier. Also, due to the very low currents during the low conduction state (LCS), there is various noise from the device and instruments in the ground state 120, The ground state 120 is where little or no voltage is applied across the memory cell 26 and hence the volatile selector 24 is in a high resistance (LCS) state. As a positive voltage is applied there is little current allowed to flow through the volatile selector 24 due to one of the Schottky diodes and it remains in its high resistance state until $1^{st}$ transition region 102 where the Schottky diode allows conduction and the volatile selector 24 then transitions almost within nanoseconds to its HCS causing the Schottky diode to become temporarily resistive and thus the operation of volatile selector 24 is a function of the applied voltage until it reaches a saturated condition and remains in its high conduction state (HCS). For both reading and programming, the voltage applied across the memory cell 26 should be greater than this Schottky transition area 102 to reach the HCS of volatile selector 24. However, when the tippled voltage is reduced, the volatile selector 24 remains in its HCS until a $2^{nd}$ transition region 104 is reached and whereby it begins to transition to its low conduction region (LCS).

However, depending on the fabrication, it may take some time (from 1 us to 1 ms or more) for the volatile selector to actually transition to the LCS state. Thus, in this $2^{nd}$ transition region, the current is a function of both applied voltage and time ($f$(V,t)), the time being dependent on the dispersion of fast diffusion atoms in the memory cell 26. As the applied voltage is reduced to zero, the ground state is reached, however, there may be a lag in the resistive change to the LCS state due to the relaxation time. When the applied voltage is reversed and allowed to go negative the volatile selector 24 remains in its LCS until $3^{rd}$ transition region 106 is reached due to the other Schottky diode barrier. As the applied negative voltage increases in magnitude, the volatile selector 24 again transitions to a HCS causing the other Schottky diode to become temporarily resistive.

Therefore, when applying a negative voltage to help disperse the fast diffusion atoms, the applied voltage should be less than the $3^{rd}$ transition region 106 magnitude. If the applied negative voltage is greater than the $3^{rd}$ transition region 106 magnitude and volatile selector 24 activated to is HCS, then to return back to its LCS, the applied voltage should be reduced to a magnitude less than a $4^{th}$ transition region 108. However, in this $4^{th}$ transition region, the fast diffusion atoms also will require time to relax to the ground state 120 and thus this $4^{th}$ transition region 108 current is also a function of voltage and time ($f$(V,t)).

Memory Cell Operation

FIGS. 3A-3D are example snapshot illustrations 200 of how an example integrated volatile selector 24 operates in tandem with a memristor non-volatile storage device 22 in memory cell 26. First will be a description of the operation of the nonvolatile storage device 22 operation with mobile dopants 206, then a description of the volatile selector device 24 operation with fast drift species 208, and then example fabrication materials for memory cell 26.

Non-Volatile Storage Device Operation

Figure 3A:
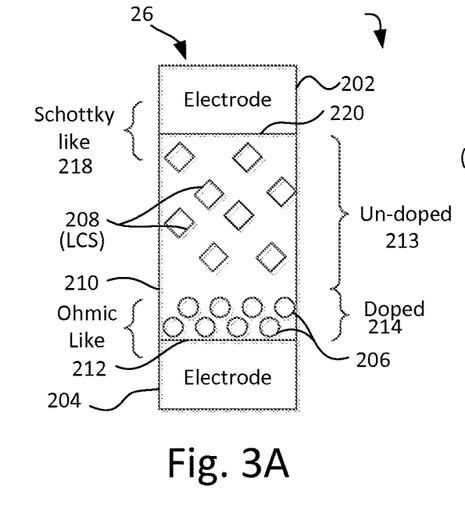
FIGS. 3A-3D are example snapshot illustrations of how an example integrated memory cell with a volatile selector operates in tandem with a non-volatile storage device.

FIG. 3A illustrates the memory cell 26 in a previously programmed state of low resistance with no voltage applied to electrodes 202, 204. The memory cell 26 has an active region 210 disposed between a first electrode 202 and a second electrode 204. In some examples, the electrodes 202 and 204 can be rows 30 and columns 20, respectively. In other examples, the electrodes 202 and 204 can be separate elements that are connected to rows 30 and columns 20. The active region 210 includes an un-doped region 212 and a doped region 214. The un-doped region 212 comprises a thin film of a material that can be a dielectric, electronically semiconducting, nominally electronically insulating, and can also be a weak ionic conductor. The material of the active region 210 is capable of transporting and hosting ions that act as dopants in order to control the flow of electrons or current (i.e., conductivity) through non-volatile storage device 22 of memory cell 26. On the other hand, the doped region 214 is composed of mobile dopants 206 that, in certain examples, may be impurity atoms that act as electron donors. Alternatively, in other examples, the mobile dopants 206 can be anion vacancies, which in the active region 210 are charged and therefore are also electron donors. In still other examples, the doped region 214 has mobile dopants 206 that may be impurity atoms that act as electron acceptors.

The terms "doped" and "un-doped" are used to indicate relative levels of dopants or other impurities that may be present in the active region 210. In particular, the term "un-doped" does not mean total absence of the dopants from the un-doped region. Rather, the term "un-doped" simply means that there are fewer dopants in the un-doped region than there are in the doped region. As a result, the un-doped region has a lower conductivity than the doped region.

The memory cell 26 can be operated by applying appropriate voltages to the electrodes 202 and 204 to create an electric field of an appropriate magnitude and polarity across the active region 210. When the magnitude and polarity of the electric field, also called a "drift field," exceeds a threshold, such as in $1^{st}$ transition region 102 and transition region 106, the dopants 206 become mobile in the active region 210 and can drift via ionic transport. The dopants 206 are specifically chosen to operate as electron acceptors or electron donors for the active region 210, and thereby change the resistance of the active region 210 material, thus creating the memristor non-volatile storage device 22.

Figure 3B:
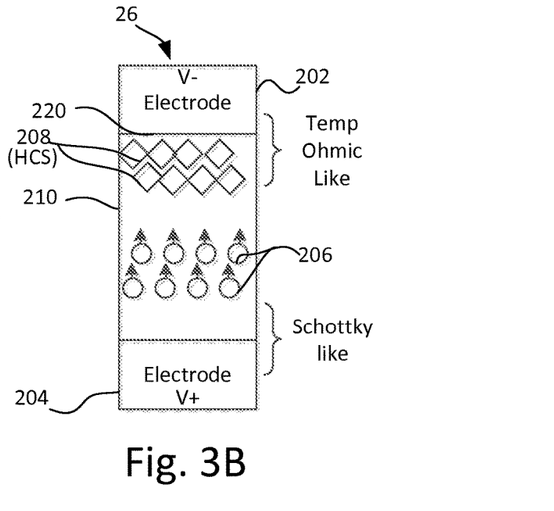

FIG. 3B shows an example of the dopants 206 driven deeper into the active region 210 after applying an appropriate drift field. Driving the dopants 206 away from the electrode 204 decreases the conductance of the active region 210 near the electrode 204. Alternatively, applying a drift field that drives the dopants 206 toward the electrode 204, such as shown in FIG. 3A, increases the conductance of the active region 210 near the electrode 204.

Positioning the dopant 206 within the active region 210 determines whether Ohmic-like and; or Schottky-like barriers are formed at electrode/active, region interfaces. The kind of Ohmic-like or Schottky-like harrier formed at the interfaces control the flow of charge carriers (i.e., electrons and holes) through the active region 210. Note, however, that the traditional description of Schottky and Ohmic barriers may not apply to a nanoscale memory cell 26 because the materials comprising the electrodes 204 and 202 and the active region 310 are on the nanometer scale. As a result, structural and electronic properties are not averaged over for which the theory of metal-semiconductor contacts has developed. Advantageous the electronic properties of un-doped electrode/active region interfaces can electronically resemble larger dimension Schottky barriers and are called "Schottky-like barriers," and the electronic properties of doped electrode/active region interfaces electronically resemble Ohmic barriers and are called "Ohmic-like barriers."

Applying a voltage across a crossbar junction to read the conductance state of the crossbar junction creates a forward bias across one interface and a reverse bias across the other interface. The terms "forward bias" and "reverse bias" are relative terms. A forward bias refers operating an electrode as an anode through which electron current flows into the active region. A reverse bias, on the other hand, refers to operating an electrode as a cathode through which electron current flows out of the active region.

As shown in FIGS. 3A-38, the mobile dopants 206 can be selectively positioned within the active region 2'10 to control the flow of charge carriers, or electron current, through the memory cell 26. An Ohmic-like barrier creates a relatively low resistance and has substantially little tendency to rectify an electron current. Conduction of electrons across the Ohmic-like barrier occurs whether the voltage across the interface is applied as a forward bias or a reverse bias. By contrast, a Schottky-like, barrier has diode-like properties. Conduction of electrons across the Schottky-like barrier depends on whether the voltage across the interface is applied as a forward bias or a reverse bias. A forward bias applied to a Schottky-like barrier formed at an interface enables electron current to flow from an electrode into the active region through the interface via thermal emission. An electron transport phenomenon called "tunneling" may also occur in some cases, which is also affected by the electronic barrier height and width. On the other hand, a reverse bias applied to a Schottky-like barrier formed at an interlace blocks the flow of electron current from the active region into the electrode at the interface. In summary, a Schottky-like, barrier has diode-like rectifying properties.

Volatile Selector Office Operation

As noted, FIG. 3A shows a first snapshot of a memory cell 26 in a previously programmed low resistance state. The memory cell 26 includes first electrodes 202, a second electrode 204, and an active region 210 disposed between the electrodes 202 and 204. The active region 210 includes a mobile dopant 206 located in close proximity to the electrode 204 and also includes a fast drift ionic species 208 distributed throughout the active region 210 material matrix. In this example, the dopants 206 and the fast drift species 208 have the same charge. For example, the dopants 206 and the fast drift species 208 can both be positively charged. Electrode 204 and dopants 206 create an Ohmic-like barrier 212 that may be characterized as a $1^{st}$ resistor, the un-doped region 213 characterized as a $2^{nd}$ resistor, and a Schottky-like barrier 218 at interface 220 may be characterized as a diode. The mobile dopants 206 are fixed when a read voltage $V_{read}$ is applied to the electrodes 202 and 204, The read voltage corresponds to operating the electrode 202 as an anode and the electrode 204 as a cathode creating a forward bias across the Schottky-like, barrier 218 at the interface 220. As a result, electron current flows from the electrode 202 through the Schottky-like barrier 218, the active region 210, and the Ohmic-like barrier 212 and out through the electrode 204.

In order to switch the non-volatile storage device 22 of memory cell 26 into a high resistance state, a write or programming voltage $V_{th}$ is applied to the memory cell 26, FIG. 36 shows a second snapshot of the memory cell 26 under a write or programming voltage. The write voltage can be a voltage pulse comprising a positive voltage applied to the electrode 204 and a negative voltage applied to the electrode 202. The fast drift species 208 is selected to have a higher mobility in the active region 210 material than the mobile dopant 206. In other words, the fast drift species 10 has a faster drift rate than the drift rate of the mobile dopants 206. As shown in the example of FIG. 3B, the write voltage causes the positively charged fast drift species 208 to rapidly transit to the interface 220 temporarily switching the Schottky like barrier 218, shown in FIG. 3A, at the interface 220 into an Ohmic-like barrier. The snapshot of FIG. 36 also shows the slower drifting mobile dopants 206 beginning to drift away from the electrode 204 causing the Ohmic-like barrier 212, shown in FIG. 3A, to transition into a Schottky-like barrier. The last drift species located along the interface 220 creates a temporary HCS interlace 220 allowing electron current created by the write voltage to temporally flow into the active region 210 effectively also preventing diode breakdown along the interface 220. In other words, if the magnitude of the write voltage is large enough to constitute a breakdown voltage, the fast drift species 208 rapidly transit into the region of the active region 210 adjacent to the interface 220 to both prevent breakdown and create the temporary Ohmic-like barrier that allows electron current to temporarily flow through the interface 220 while the write voltage is being applied, thus performing the selector capability, which is a function of voltage and time ($f(V,t)$).

Figure 3C:
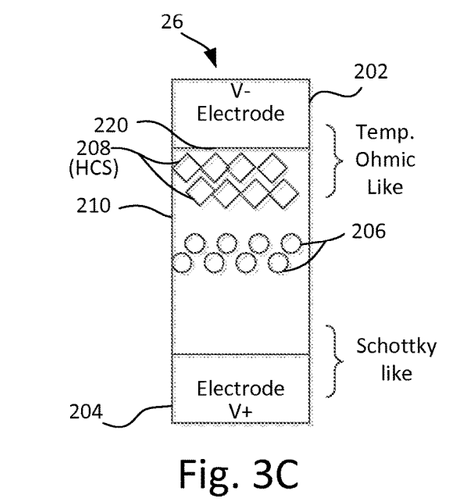

FIG. 3C shows a third snapshot of the memory cell 26 under the write voltage after more time has progressed. As shown in FIG. 3C, the duration of the write voltage is applied long enough to ensure that the dopants 206 drift into the approximate central region of the active region 210 resulting in a high resistance state for the non-volatile storage device 22. As a result, a Schottky-like barrier forms along the interface at electrode 204. While the write voltage is still in effect, the fast drift species 208 remains near the interface 220 maintaining the temporary low resistance Ohmic-like barrier enabling the volatile selector 24 HCS state.

Figure 3D:
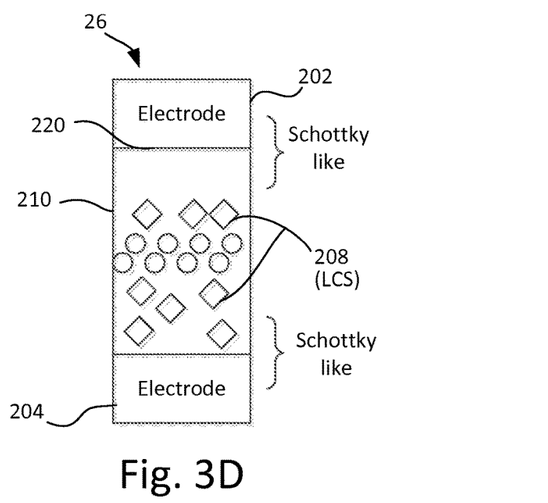

FIG. 3D shows a fourth snapshot of the non-volatile storage device 22 of the memory cell 26 in a high resistance state after the write voltage has been removed. Because the fast drift species can diffuse within the active region 210, after the write voltage is removed the fast drift species diffuses into the un-doped regions of the active region 210 restoring the Schottky-like barrier and causing the volatile selector to transition to its LCS state.

However, as noted previously, depending on the fabrication used, the fast drift species can take more than 1 us and up to 1 ms or more to relax the volatile selector 24 from its HCS state to the LCS state. Example timing of the applied voltages to memory cell 26 to reduce the relaxation time are discussed in FIGS. 4A-4D.

Memory Cell Fabrication Materials

The examples illustrated are limited to the mobile dopants 206 and the fast drift species 208 having a positive charge. In other examples, the dopants 206 and the fast drift species 208 can both be negatively charged and are attracted to positive charges and repelled by negative charges.

Various compositions of crossbar junctions configured in accordance with examples of the present claimed subject matter are now described with reference to FIGS. 3A-3D, The active region 210 can be composed of an elemental and/or compound semiconductor. Elemental semiconductors include silicon (Si), germanium (Ge), and diamond (C). Compound semiconductors include group IV compound semiconductors, III-V compound semiconductors, and II-VI compound semiconductors. Group IV compound semiconductors include combinations of elemental semiconductors, such as SiC and SiGe. II-V compound semiconductors are composed of column IIIa elements selected from boron (B), aluminum (Al), gallium (Ga), and indium (In) in combination with column Va aliments selected from nitrogen (N), phosphorus (P), arsenic (As), and antimony (Sb). III-V compound semiconductors are classified according to the relative quantities of III and V elements. For example, binary compound semiconductors include, but are not limited to, BN, BP, BSb, AlP, AlAs, AlSb, GaAs, GaSb, GaP, InN, InP, InAs, and InSb. Ternary compound semiconductors include, but are not limited to, InGaP, AlInAs, GaAsN, AlGaN, AlGaP, InGaN, and InAsSb. Ternary compound semiconductors also include varying quantities of elements, such as GaAsyP1-y and InyGa1-yAs, where y ranges from greater than 0 to less than 1. Quaternary compound semiconductors include, but are not limited to, AlGaInP, InAlGaP, InGaAlP, AlInGaP, AlGaAsN, InAlAsN. Quaternary compound semiconductors also include varying quantities of elements, such as InxGa1-xAsyP1-y, where both x and y independently range from greater than 0 to less than 1. Quinary compound semiconductors include, but are not limited to, GaInNAsSb and GaInAsSbP. II-VI semiconductors are composed of column IIb elements selected from zinc (Zn), cadmium (Cd), mercury (Hg) in combination with column VIa elements selected from oxygen (O), sulfur (S), selenium (Se), and tellurium (Te). For example, binary II-VI semiconductors include, but are not limited to, CdSe, CdS, CdTe, ZnSe, ZnS, and ZnO.

The active region 210 can be composed of other types of suitable compound semiconductors including II-VI ternary alloy semiconductors, such as CdZnTe, HgCdTe, and HgZnSeI; IV-VI compound semiconductors, such PbSe, PbS, SnS, and SnTe; and IV-VI ternary compound semiconductors, such as PhSnTe, Tl2SnTe5, Tl2GeTe5. The active region 210 can also be composed of a II-V compound semiconductor including, but not limited to, Cd3P2, Cd3As2, Zn3P2, Zn3As2, and Zn3Sb2, and other compound semiconductors, such as Pb2I, MoS2, GaSe, SnS, Bi2S3, PtSi, and BiI3. Semiconductor compounds consisting of some noble metal elements with a high mobility at room temperature, such as Ag, Cu, Au are especially interesting. The active region 210 can also be composed of a semiconducting nitride or a semiconducting halide. For example, semiconducting nitrides include AlN, CaN, ScN, YN, LaN, rare earth nitrides, alloys of these compounds, and more comp ex mixed metal nitrides, and semiconducting halides include CuCl; CuBr, and AgCl.

In other examples, the active region 210 can also be a mixture of the different compound semiconductors described above. The mobile dopant 208 can be an anion vacancy or an aliovalent element. In other examples, the dopants can be p-type impurities, which are atoms that introduce vacant electronic energy levels called "holes" to the electronic band gaps of the active region. These dopants are also called "electron acceptors." in still other examples, the dopants can be n-type impurities, which are atoms that introduce filled electronic energy levels to the electronic band gap of the active region. These dopants are called "electron donors." For example, boron (B), Al, and Ga are p-type dopants that introduce vacant electronic energy levels near the valence band of the elemental semiconductors Si and Ge; and P, As, and Sb are n-type dopants that introduce tilled electronic energy levels near the conduction band of the elemental semiconductors Si and Ge. In III-V compound semiconductors, column VI elements substitute for column V atoms in the III-V lattice and serve as n-type dopants, and column II elements substitute for column III atoms in the III-V lattice to form p-type dopants.

In other examples, the active region 206 can be composed of oxides that contain at least one oxygen atom (O) and at least one other element. In particular, the active region 102 can be composed of titanic (TiO2), zirconia (ZrO2), and hafnia (HfO2). These materials are compatible with silicon (Si) integrated circuit technology because they do not create doping in the Si. Other examples for the active region 206 include alloys of these oxides in pairs or with all three of the elements Ti, Zr, and Hf present. For example, the active region 102 can be composed of TixZryHfzO2, where x+y+z=1. Related compounds include titanates, zirconates, and hafnates. For example, titanates includes ATiO3, where A represents one of the divalent elements strontium (Sr), barium (Ba) calcium (Ca), magnesium (zinc (Zn), and cadmium (Cd). In general, the active region 102 can be composed of ABO3, where A represents a divalent element and B represents Zr, and Hf. The active region 102 can also be composed of alleys of these various compounds, such as CaaSrbBacTixZryHfzO3, where a+b+c=1 and x+y+z=1. There are also a wide variety of other oxides of the transition and rare earth metals with different valences that may be used, both individually and as more complex compounds. In each case, the mobile dopant can be an oxygen vacancy or an aliovalent element doped into the active region 206, The oxygen vacancies effectively act as dopants 208 with one shallow and one deep energy level. Because even a relatively minor nonstoichiometry of about 0.1% oxygen vacancies in TiO2-x is approximately equivalent to $5\times10^{19}$ dopants/cm$^3$, modulating oxygen vacancy profiles have strong effect on electron transport.

In other examples, the active region 206 can be a sulfide or a selenide of the transition metals with some ionic bonding character, essentially the sulfide and selenide analogues of the oxides described above.

In other examples, the active region 206 can be a semiconducting nitride or a semiconducting halide. For example, semiconducting nitrides include AlN, GaN, ScN, YN, LaN, rare earth nitrides, and alloys of these compounds and more complex mixed metal nitrides, and semiconducting halides include CuCl, Cu Br, and AgCl. The active region 206 can be a phosphide or an arsenide of various transition and rare earth metals. In all of these compounds, the mobile dopant can be an anion vacancy or an aliovalent element.

A variety of dopants can be used and are selected from a group consisting of alkaline earth cations, transition metal cations, rare earth cations, oxygen anions or, vacancies, chalcogenide anions or vacancies, nitrogen anions or vacancies, pnictide anions or vacancies, or halide anions or vacancies.

TABLE

Exemplary List of Doped, Un-doped, and Mobile Dopants Composing Compound Materials.

| Un-doped | Doped | Mobile Dopant |
| --- | --- | --- |
| TiO2 | TiO2-x | Oxygen vacancies |
| ZrO2 | ZrO2-x | Oxygen vacancies |
| HfO2 | HfO2-x | Oxygen vacancies |
| SrTiO2 | SrTiO2-x | Oxygen vacancies |
| GaN | GaN1-x | Nitrogen vacancies |
| CuCl | CuCl1-x | Chlorine vacancies |
| GaN | GaN:S | Sulfide ions |

The last drift ionic species 210 is selected to have the same charge as the mobile dopant in the example shown here. When the mobile dopant 208 is positively charged, the fast drift species 210 is a positively charged ion. Positively charged fast drift ionic species include, hut are not limited to, hydrogen ion (H+), lithium ion (Li+), sodium ion (Na+), and potassium ion (K+). When the mobile dopant 208 is negatively charged, the fast drift species 210 is a negatively charged ion. Negatively charged fast drift ionic species include, but are not limited to, fluorine (F−) and chlorine (Cl−). It may also be possible that opposite charges are selected for the fast drift ionic species and the mobile dopant in some cases.

In addition to the large variety of combinations of semiconductor materials and suitable dopants comprising the active region 206, the electrodes 202 and 204 can be composed of platinum (Pt), gold (Au), copper (Cu), tungsten (W), aluminum (Al) or any other suitable metal, metallic compound (e.g. some perovskites with or without dopants such as BaTiO3 and Ba1-xLaxTiO3PrCaMnO3) or semiconductor. The electrodes 202 and 204 can also be composed of metallic oxides or nitrides, such as RuO2, IrO2, TaN, WN, and TiN. The electrodes 202 and 204 can also be composed of any suitable combination of these materials.

For example, in certain examples, the first electrode 202 can be composed of Pt, and the second electrode 204 can be composed Au. In other examples, the first electrode 202 can be composed of Cu, and the second electrode 204 can be composed of IrO2. In still other examples, the first electrode 202 can be composed of a suitable semiconductor, and the second electrode 204 can be composed of Pt.

Memory Cell Electrical Operation Protocol

Figure 4A:
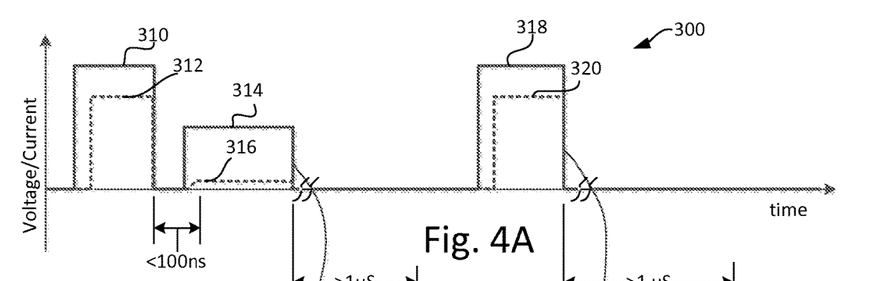
FIGS. 4A-4B are example timing diagrams illustrating the example memory cell applied voltages and currents without a relaxation reduction pulse.
Figure 4B:
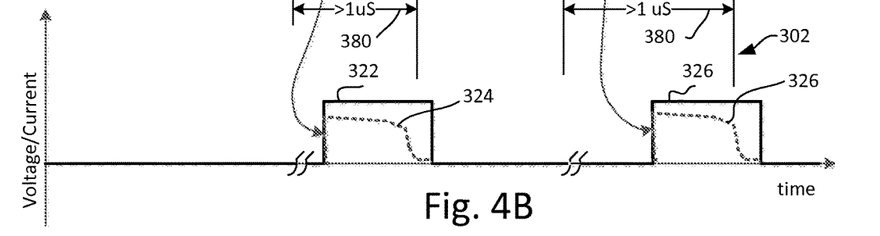

FIGS. 4A-4B are example timing diagrams 300, 302 illustrating the example selector applied voltages levels and currents without a relaxation reduction pulse. The horizontal axis represents time and the vertical axis represent voltage or current for the respective signal, the voltage in solid line, the current in dashed line. In FIG. 4A, the memory cell 26 has a positive Vu programming or write voltage pulse 310 applied which causes the non-volatile selector 24 to transition to a HCS state. During this pulse 310, a current 312 flows through the memory cell 26. When reading the same memory cell 26, such as applying a $V_{read}$ voltage pulse 314 to verify the programming, the delay for reading current 316 can be less than 100 ns as pulse 314 also transitions the volatile selector 24 in memory cell 26 to its HCS state.

FIG. 4B is a voltage/current vs time plot for another memory cell 26 on a different row or column line than the memory cell 26 in FIG. 4A. After the read voltage pulse 314 is removed, the volatile selector 24 of FIG. 4A is still in its HCS state and transitions to its LCS ground state over a relaxation time 380 of at least 1 uS and perhaps up to 1 mS. This relaxation time 380 results in the controller 40 having to delay its reading of another memory cell 26' with voltage pulse 322 from the reading on a prior memory cell 26 due to potential sneak path currents 324 from previously read memory cells 26 that have not relaxed fully. The sneak path currents may cause the value of the resistance read from the other memory cell 26' to be inaccurate and thus cause bit errors.

Similarly, as FIGS. 4A and 4B show, the same relaxation time 380 occurs when just a programming pulse 318 and programming current 320 cause the volatile selector 24 in memory cell 26 to transition to the HCS state and another memory cell 26' is read with read voltage pulse 326 resulting in sneak currents 326 possibly appearing in the reading non-volatile storage device in the other memory cell 26'.

Figure 4C:
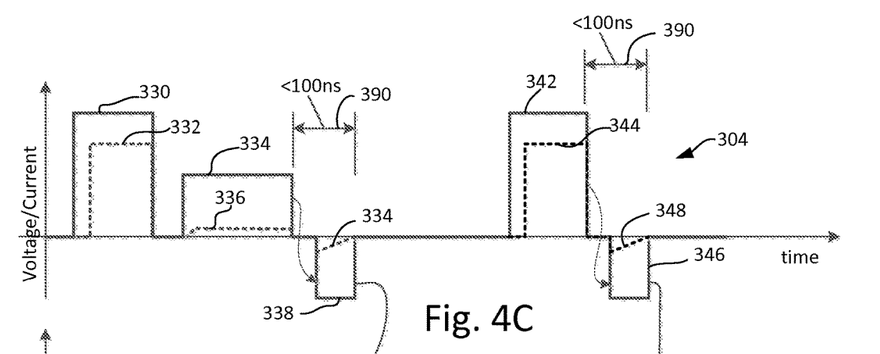
FIGS. 4C-4D are example timing diagrams illustrating the example memory cell applied voltages and currents with a relaxation reduction pulse.
Figure 4D:
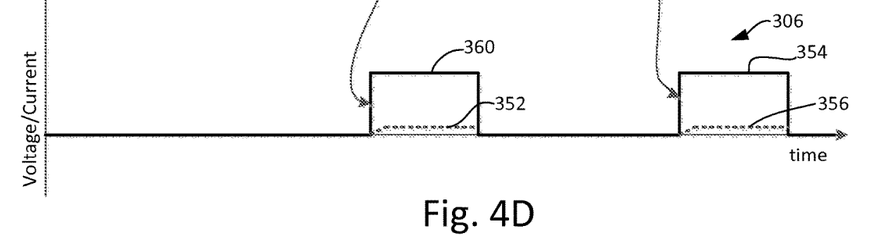

FIGS. 4C-4D are example timing diagrams 304, 306 illustrating the example memory cell 26 applied voltages levels and currents with a relaxation reduction pulse to reduce the relaxation time. In FIG. 4C a programming pulse 330 is applied to memory cell 26 which transitions its volatile selector 24 to a HCS which allows current 332 to flow in the non-volatile storage device 22. A read voltage pulse 334 can be done on the memory cell 26 to read the non-volatile storage device 22 current 336 of the non-volatile storage device to ensure the programming was correct. This read voltage pulse 334 also transitions the volatile selector 24 to its HCS state. After the read of memory cell 26 is complete, a short opposite polarity pulse 338 (of either the respective read or programming voltage) but of a lesser magnitude such that the volatile selector 24 does not transition to its other HCS state. Current 334 shows the possible sneak current through the memory cell 22 rapidly approaching zero in less than 100 ns for reduced relaxation time 390 as the volatile selector transitions quickly to its LCS state by the opposite voltage pulse 338 helping to disperse the fast drift ionic species 208 into the active region 210 without causing them to progress far enough to change the behavior of the Schottky-like barriers at the electrode regions of memory cell 26. Thus, as shown in FIG. 4D a read voltage pulse 360 can be done by the controller 40 right after the opposite polarity pulse 338 is complete as any sneak path currents have been reduced by having all the previously read or programmed volatile selectors 24 in memory cells 22 returned to their LCS ground state of low conductance, which value is at least four orders of magnitude lower than the HCS high conductance value.

Similarly, after a programming voltage pulse 342 is applied to allow programming current 344 to flow activating the volatile selector 24 HCS state, an opposite voltage pulse 346 of a lower magnitude can be applied to memory cell 22 to transition the volatile selector 26 back to is LCS in reduced relaxation time 390 of less than 100 ns. This opposite polarity pulse 346 then allows the controller 40 to apply a read pulse 354 to another memory cell 22' and read the current 356 of its non-volatile storage device 22.

Figure 5:
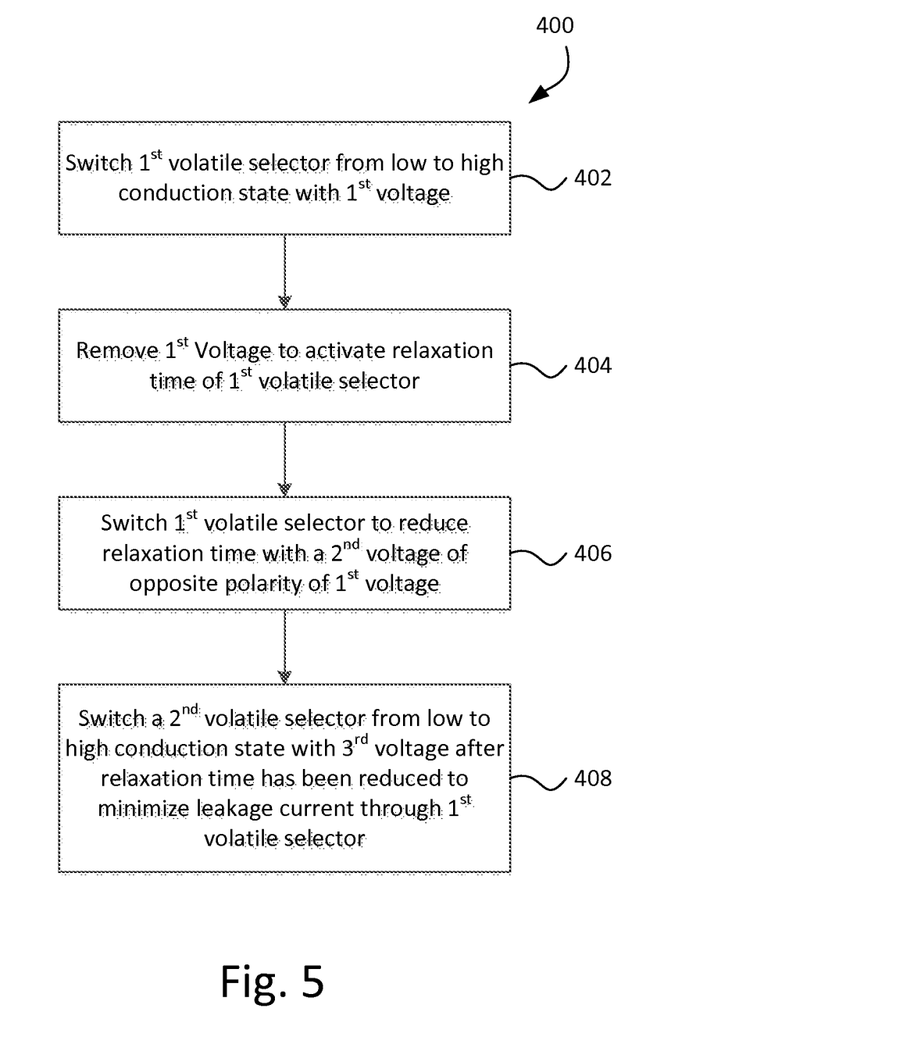
FIG. 5 is an example flow chart of a process or electrical operation protocol to implement a relaxation reduction pulse in the operation of a cross-bar array.

FIG. 5 is an example flow chart 400 of a process or electrical operation protocol to implement the relaxation reduction pulse in the operation of a cross-bar array 10. In block 402 a first volatile selector 24 of a memory cell 26 in the cross-bar array 10 is switched from its low conduction state to its high conduction state with a first voltage. Then in block 404 the first voltage is removed and this activate or begins a relaxation time for the first volatile selector 24. In block 406, a second voltage of an opposite polarity of the first voltage is applied to the memory cell 26 to switch the non-volatile selector 24 to its low conduction state, thereby reducing the relaxation time to less than 100 ns. Finally, in block 408, a second memory cell 22' having a second volatile selector is switched from its low conduction state to its high conduction state with a third voltage pulse after the relaxation time in block 406 has been reduced thereby minimizing sneak or other leakage current to flow through the first volatile selector 24 and into the second volatile selector 24'.

Accordingly, the electrical operation protocols disclosed above allow the speed of performance of cross-bar arrays to be improved significantly allowing for replacement of all types of cache memory by addressing the issue of selector relaxation time that affects sneak currents. These improved cross-bar arrays memory systems accordingly will allow for very dense, low cost, and low power storage systems that will dramatically increase processing speeds by orders of magnitude while lowering power consumption for the next generation of computing devices without having to rely on the lithographic shrinking of transistors.

While the present claimed subject matter has been particularly shown and described with reference to the foregoing preferred and alternative examples, those skilled in the art will understand that many variations may be made therein without departing from the spirit and scope of the claimed subject matter as defined in the following claims. This description of the claimed subject matter should be understood to include all novel and non-obvious combinations of elements described herein, and claims may be presented in this or a later application to any novel and non-obvious combination of these elements. The foregoing examples are illustrative, and no single feature or element is essential to ail possible combinations that may be claimed in this or a later application. Where the claims recite "a" or "a first" element of the equivalent thereof, such claims should be understood to include incorporation of one or more such elements, neither requiring nor excluding two or more such elements.

What is claimed is:

1. A storage system, comprising:
   a set of memory cells, each memory cell comprises a volatile selector and a non-volatile storage device, the volatile selector integrated with the non-volatile storage device, the volatile selector characterized as having a relaxation time;

a crossbar array comprises a first set of wires, and a second set of wires crossing the first set of wires, each memory cell having the respective selector connected to one of the first set of wires and having the respective memory device connected to one of second set of wires; and a controller to provide,
first signals to the first set of wires and the second set of wires to allow for programming or reading of one or more non-volatile storage devices using respective one or more of the volatile selectors which activates the relaxation time, and
second signals to first set of wires and the second set of wires to significantly shorten the relaxation time of the volatile selectors.

2. The storage system of claim 1 where in the controller further provides third signals to the first set of wires and the second set of wires to allow for reading of one or more non-volatile storage devices after the second signals have significantly shortened the relaxation time.

3. The storage system of claim 1, wherein the relaxation time is characterized as greater than one microsecond and the significantly shortened relaxation time is less than 100 ns.

4. The storage system of claim 1, wherein the volatile selector has a ratio between a high conduction state and a low conduction state of greater than four orders of magnitude when the relaxation state has been significantly shortened by the second signals.

5. The storage system of claim 1, wherein the volatile selector contacts an electrode of fast diffusive atoms and the volatile selector changes state based on an electric field controlling the fast diffusive atoms.

6. A method of operating a volatile selector, comprising:
switching the volatile selector from a low conduction state to a first high conduction state with a first voltage level;
removing the first voltage level thereby activating a relaxation time for the volatile selector, the relaxation time being defined as the time the first volatile selector transitions from the high conduction state back to the low conduction state; and
switching the volatile selector with a second voltage level of opposite polarity to the first voltage level to significantly reduce the relaxation time of the volatile selector.

7. The method of claim 6, further comprising switching a second volatile selector to a second high conduction state with a third voltage level immediately after the relaxation time of the first volatile selector has been reduced thereby minimizing any leakage current through the first volatile selector while the second volatile selector is in a second high conduction state.

8. The method of claim 6, wherein the relaxation time is characterized as greater than one microsecond and the step of switching the volatile selector with a second voltage level is less than 100 ns.

9. The method of claim 6, wherein the volatile selector has a ratio between the high conduction state and the low conduction state of greater than four orders of magnitude when the relaxation state has been significantly shortened by the second signals.

10. The method of claim 6, wherein the volatile selector contacts an electrode of fast diffusive atoms and the volatile selector changes state based on an electric field controlling the fast diffusive atoms.

11. A controller for operating a set of memory cells in a crossbar array, comprising:
logic to control,
a first set of switches having,
a closed state to provide a first voltage used to change the state of at least one volatile selector in the set of memory cells from a low conduction state to a first high conduction state, and
an open state to change the state of the at least one volatile selector from the first high conduction state to the low conduction state within a relaxation time; and
a second set of switches having,
a closed state to provide a second voltage opposite the first voltage to significantly reduce the relaxation time, and
an open state to return the state of the at least one volatile selector to the low conduction state.

12. The controller of claim 11, wherein the logic further to control,
a third set of switches having,
a closed state to provide a third voltage to change the state of the at least one volatile selector to a second high conduction state immediately after the relaxation time of the at least one volatile selector has been reduced to read a storage device thereby minimizing any leakage current through the at least one volatile selector, and
an open state to return the state of the at least one volatile selector to the low conduction state.

13. The controller of claim 11, wherein the relaxation time is characterized as greater than one microsecond and the step of switching the at least one volatile selector with a second voltage level is less than 100 ns.

14. The controller of claim 11, wherein the at least one volatile selector has a ratio between the first high conduction state and the low conduction state of greater than five orders of magnitude when the relaxation state has been significantly shortened by the second signals.

15. The controller of claim 11, wherein the at least one volatile selector contacts an electrode of fast diffusive atoms and the at least one volatile selector changes state based on an electric field controlling the fast diffusive atoms.

* * * * *